United States Patent [19]
Kawakami et al.

[11] Patent Number: 5,704,981
[45] Date of Patent: Jan. 6, 1998

[54] PROCESSING APPARATUS FOR SUBSTRATES TO BE PROCESSED

[75] Inventors: Shunji Kawakami; Yoji Mizutani, both of Kanagawa-ken; Yutaka Miura; Takahiro Shimoda, both of Yamanashi-ken, all of Japan

[73] Assignee: Tokyo Electron Ltd., Tokyo-to, Japan

[21] Appl. No.: 626,454

[22] Filed: Apr. 2, 1996

[30] Foreign Application Priority Data

Apr. 5, 1995 [JP] Japan .................................. 7-106990

[51] Int. Cl.$^6$ ................................................. C23C 16/00
[52] U.S. Cl. ............................. 118/715; 118/725; 156/345
[58] Field of Search ................................. 118/715, 725; 156/345

[56] References Cited

U.S. PATENT DOCUMENTS 4,924,807  5/1990  Nakayama ........................... 118/725

FOREIGN PATENT DOCUMENTS

| | | |
|---|---|---|
| 60-130126 | 7/1985 | Japan . |
| 62-80271 | 4/1987 | Japan . |
| 63-46485 | 4/1989 | Japan . |
| 1-134911 | 5/1989 | Japan . |
| 62-291923 | 5/1989 | Japan . |
| 1-220434 | 9/1989 | Japan . |
| 63-329948 | 5/1990 | Japan . |
| 2-174224 | 7/1990 | Japan . |
| 1-333589 | 8/1991 | Japan . |
| 3-194924 | 8/1991 | Japan . |
| 6-274400 | 5/1996 | Japan . |
| 8-115883 | 5/1996 | Japan . |

*Primary Examiner*—Richard Bueker
*Attorney, Agent, or Firm*—Beveridge, DeGrandi, Weilacher & Young LLP

[57] ABSTRACT

A partition member with a buffer plate disposed on the top surface thereof is disposed in a region belonging to a surface-to-be-processed of a substrate-to-be-processed held in a processing apparatus. An injector having cross-sectional areas decreasing toward the forward end thereof is disposed in the partition member. The injector has a number of injection holes formed length-wise therein at a constant pitch and in the same bore, whereby a processing gas can be injected very uniformly in the longitudinal direction and diffuse in the partition member. Then the processing gas is passed through vent holes formed in the buffer plate uniformly into the processing chamber. The processing gas can be fed uniformly onto the surface-to-be-processed of the substrate-to-be-processed, and a deposited thin film can have high intra-surface thickness uniformity.

6 Claims, 5 Drawing Sheets

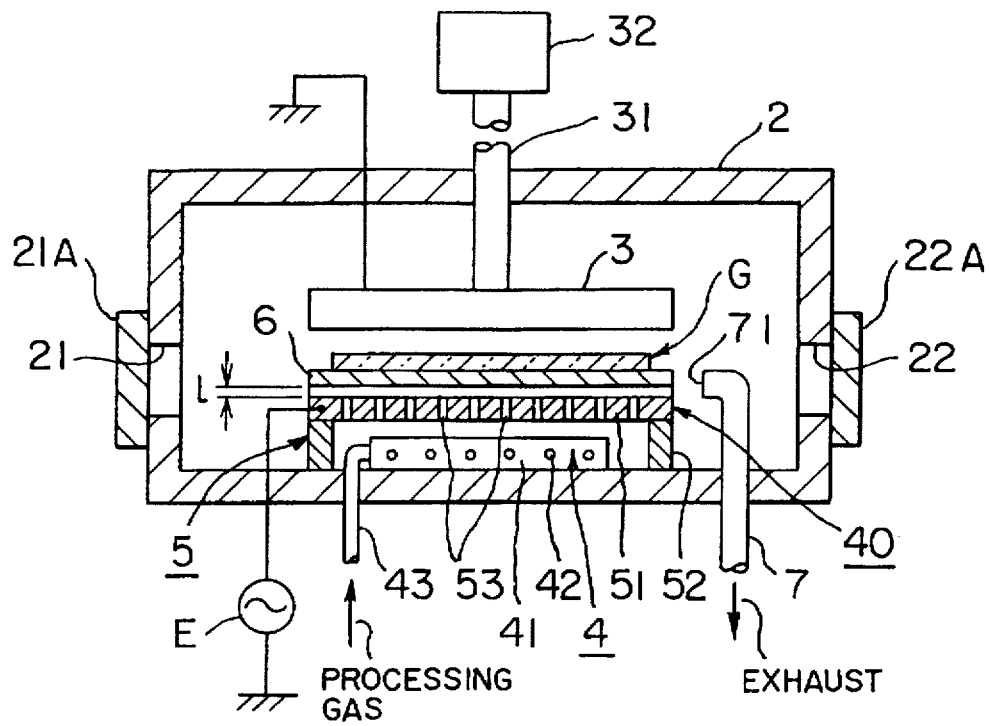
F I G. 1
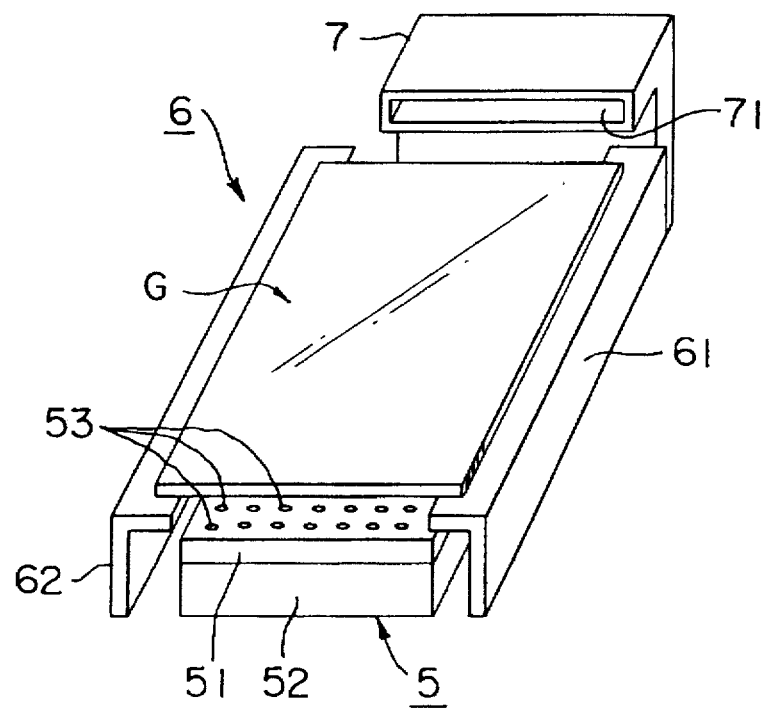
F I G. 2

PROCESSING APPARATUS FOR SUBSTRATES TO BE PROCESSED

BACKGROUND OF THE INVENTION

The present invention relates to a processing apparatus for a substrate to be processed. TFT (Thin Film Transistor)-LCDs (Liquid Crystal Display) have been finding more applications in personal computers, televisions, game displays, etc. because of their advantages, such as lightness, thinness, low electric power consumption, high image quality, etc. In fabricating TFT-LCDs, first TFTs are formed on a substrate of, e.g., glass, which is a substrate to be processed, then after the steps of connecting the TFTs to picture element electrodes and mounting IC chips and other steps, the TFT substrate and a color filter substrate are aligned, and a liquid crystal is sealed therebetween.

In this fabrication of TFT-LCDs, to form TFTs on the glass substrate it is necessary to subject the surface of the glass substrate to processing, such as film deposition, etching, etc., as in the fabrication of semiconductor wafers. To make such processing homogeneous in the surfaces of glass substrates which have been recently made larger, various contrivances have been tried in processing apparatuses for the film deposition and etching, etc.

One example of the conventional film deposition on an LCD substrate will be explained. In this film deposition processing, as shown in FIG. 9, a glass substrate G loaded into a vacuum vessel (not shown) is supported with a surface to be processed faced downward, and a processing gas is fed to the surface to be processed faced downward from an injector 11 disposed on the bottom of the vacuum vessel. After the processing, the used processing gas is evacuated through an exhaust port (not shown) disposed on a side of a space between the glass substrate G and the injector 11. Then, an electric field, for example, is formed in the vacuum vessel by electrodes (not shown) to generate plasmas to deposit a film on the surface to be processed of the glass substrate G.

To obtain an intra-surface uniformity of a thickness of a film deposited on the glass substrate, it is necessary to feed a processing gas homogeneously to the entire glass substrate G. However, in a case that gas injection holes 12 of the same size bore are formed in the injector 11 at a uniform pitch, a processing gas flows forward in the injector 11, being injected first through those of the gas injection holes 12 on the foreground as viewed in FIG. 9 and sequentially through those thereof on the background. Accordingly a flow rate of the processing gas in the injector 1 decreases in its flowing direction, i.e., toward the forward end thereof. As a result, a pressure distribution of the processing gas in the injector 11 has a negative gradient toward the forward end thereof. Accordingly a uniform injection amount of the processing gas cannot be obtained length-wise of the injector 11, and the processing gas cannot be fed uniformly onto the surface of the glass surface.

Conventionally injection amounts of the processing gas through the respective injection holes 12 are made uniform by, in accordance with positions of the respective injection holes 12, providing the injection holes 12 at different pitches or giving the injection holes 12 different bores. Pitches and bores of the injection holes 12 are determined by a pressure distribution of the processing gas in the injector 11. The pressure distribution, however, varies in accordance with a position and a bore of one injection hole 12. Accordingly it is very difficult to set pitches of the injection holes 12 and bores thereof over a full length of the injector 11, whereby to adjust a flow rate of the processing gas.

The machining for boring a plurality of injection holes in the injector 11 at different pitches and in different bores is bothering and needs labor. In addition to this, the setting of pitches and bores thereon is difficult. To obtain uniform processing gas feed, tries must be made, and longitudinal direction of the gas injection unit function to mitigate the pressure gradient in the flow passage of the gas injection unit, whereby a uniform pressure distribution in the gas injection unit can be obtained, and uniform gas flow rates through the respective gas injection holes can be obtained.

BRIEF DESCRIPTION OF THE DRAWINGS

FIG. 1 is a vertical sectional view of the processing apparatus according to the present invention.

FIG. 2 is a perspective view of a holding/processing unit of the processing apparatus of FIG. 1, for a substrate to be processed (glass substrate).

DETAILED DESCRIPTION OF PREFERRED EMBODIMENTS

[A First Embodiment]

Figure 3:
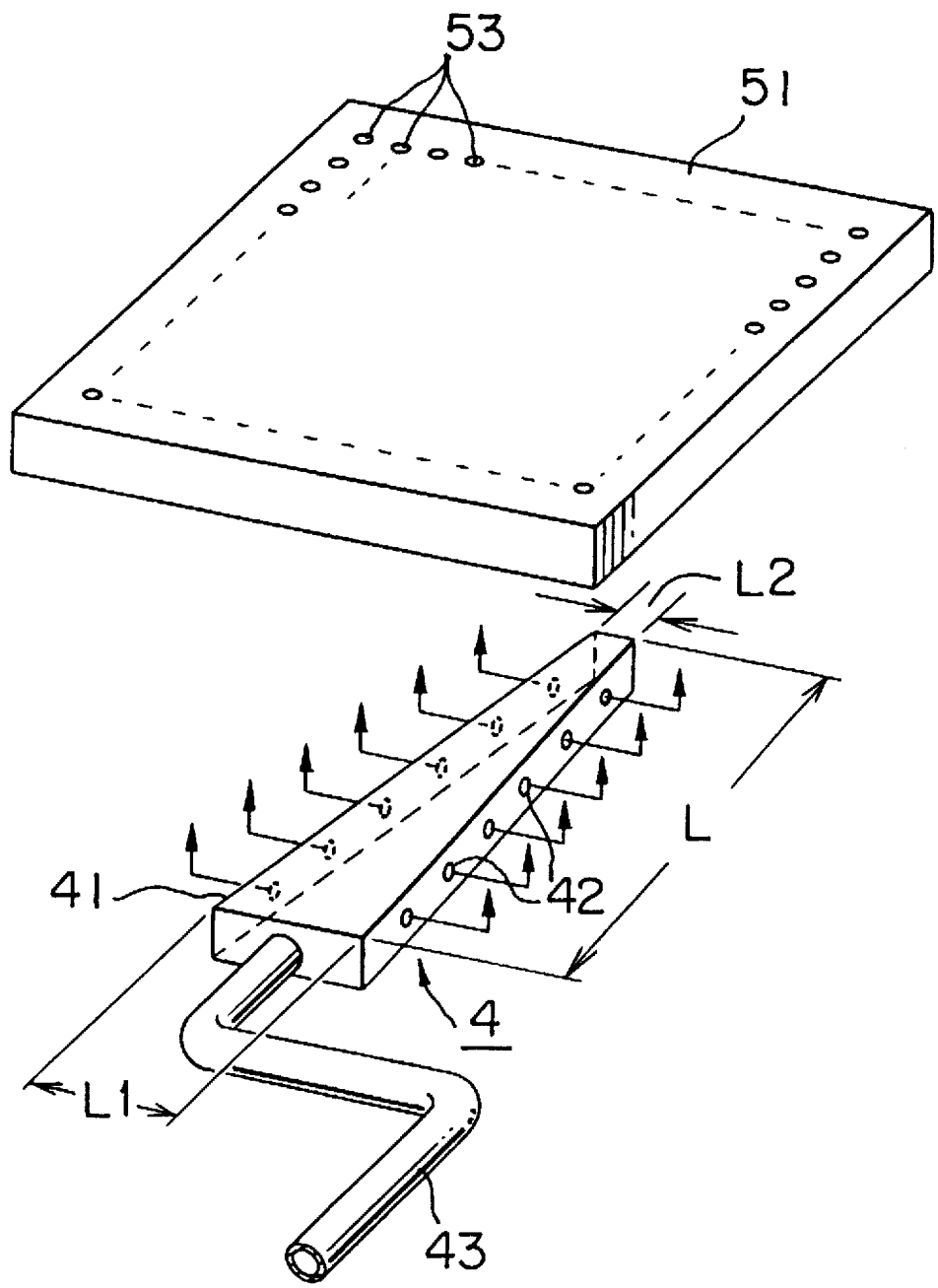
FIG. 3 is an exploded perspective view of the injector and the buffer plate of the processing apparatus of FIG. 1.

The processing apparatus according to a first embodiment of the present invention will be explained with reference to FIG. 1. FIG. 1 is a schematic vertical sectional view of the processing apparatus for a substrate to be processed according to the first embodiment of the present invention, which specifically shows a general for each try the machining of the injector 11 must be repeated. These works are generally very complicated and add to fabrication costs. This is a problem.

In addition, in the conventional film deposition apparatus, a processing gas is fed through the injector 11 into a vacuum vessel while the interior of the vacuum vessel is evacuated through the exhaust port. The processing gas has higher velocities near the exhaust port, and has lower velocities remote from the exhaust port, causing gas stagnation. As a result, the flow of the processing gas is not consistent, which makes it impossible to deposit on the glass substrate G a film of a thickness which is uniform in the surface. This is also a problem.

SUMMARY OF THE INVENTION

The present invention was made in view of these problems of the conventional art, and an object of the present invention is to provide a processing apparatus which can uniformly feed a processing gas onto a substrate to be processed and enables processing with intra-surface uniformity.

The present invention is characterized by a processing apparatus in which gas feed means disposed opposed to a substrate-to-be-processed held in a processing vessel feeds a processing gas to the substrate for processing the substrate, the gas feed means being disposed on a forward end of a gas feed pipe, and comprising a gas injection unit which includes a hollow member having cross-sectional areas which decrease toward the forward end thereof and a plurality of gas injection holes formed in the hollow member in the longitudinal direction thereof.

In the processing apparatus according to the present invention, the gas injection unit has cross-sectional areas which decrease gradually toward the forward end of the gas feed pipe, whereby a positive pressure gradient is formed in the flow passage of the gas injection unit in a flowing direction of a processing gas. The injection holes formed at a constant pitch and in the same bore in the structure of a plasma CVD. FIG. 2 is a perspective view of a major part of the processing apparatus of FIG. 1. A processing chamber 2 (vacuum vessel) 2 of an air-tight structure which is a processing vessel for a substrate to be processed has a loading opening 21 and an unloading opening 22 for an object to be processed, e.g., glass substrate G, formed in sides thereof through gate valves 21A, 22A.

As shown in FIG. 1, one grounded electrode 3 is disposed at an upper position inside the processing chamber 2. A lift rod 31 which is moved up and down by a lift mechanism 32 disposed outside the processing chamber 2 is provided on the top of the electrode 3. Gas feed means 40 is disposed inside the processing chamber 2 at the center of the bottom thereof. The gas feed means 40 comprises an injector 4 which injects gases, and a box-shaped partition member 5 which encloses the injector 4 to separate the injector 4 air-tight from the interior of the processing chamber 2. Thus, a substrate-to-be-processed holding/processing unit is formed.

As shown in FIG. 3, the injector 4 has trapezoidal longitudinal section which is tapered toward the forward end thereof, and comprises a quartz hollow member 41 having rectangular cross-section which is perpendicular to the longitudinal direction thereof, and a plurality of injection holes 42 formed in both vertical sidewalls thereof, e.g., serially in the longitudinal direction. A gas feed pipe 43 has one end connected to the proximal end (on the foreground as viewed in FIG. 3) and the other end connected to processing gas sources (not shown).

As shown in FIG. 3, the injector 4 has a shape and a size of the hollow member 41, and a pitch and a bore of the gas injection holes 42 so set that a processing gas fed through the gas feed pipe 43 can be injected in a substantially constant amount into the processing chamber 2. That is, in the first embodiment, the hollow member 41 has, for example, a length L of 360 mm, a length L1 of one side of the foreground end face, as viewed in FIG. 3, of 21 mm, and a length L2 of one side of the forward end face of 27 mm (has the so-called "wedge shape"). A bore of the injection holes 42 is set at 1 mm, and a pitch there of is set at 35 mm.

As shown in FIG. 2, the partition member 5 comprises a buffer plate 51 in the form of a rectangular plate of, e.g., 450 mm×450 mm spaced from the top surface of the injector 4 by a certain distance, and sidewall plates 52 enclosing a space with the injection 4 positioned in on the sides of the buffer plate 51. A number of vent holes 53 are formed in the buffer plate 51. The buffer plate 51 is disposed for feeding over wide plane a processing gas injected substantially uniformly from the respective injection holes 41 of the injector 4. The buffer plate 51 is made of, e.g., an aluminium plate, functions as the other electrode, and is connected to one end of a high-frequency power source of 50 kHz–200 MHz, e.g., 13.5 MHz. The vent holes 53 are formed in the buffer plate in a matrix in a smaller bore, e.g., 0.5 mm and at a smaller pitch, e.g., 20 mm than those of the injection holes 41.

As shown in FIG. 2, on both sides of the partition member 5 there are disposed a pair of mount plates 61, 62 having the upper ends bent in a L-shape. A glass substrate is mounted on the top surfaces of the bent portions of the mount plates 61, 62 with the surface-to-be-processed faced down. A distance l (see FIG. 1) between the underside of the glass substrate G and the top surface of buffer plate 51 at this time is set in accordance with a processing condition. A glass substrate may be mounted with the surface-to-be-processed faced up. In this case, the respective constructional members are disposed up-side-down.

An exhaust pipe 7 having an elongate exhaust port 71 is disposed at a position which confronts one side of a space between the glass substrate G and the buffer plate 51. The exhaust pipe 7 is passed downward through the bottom of the the buffer plate 51, the processing gas increases its amount therein, accordingly increasing an internal pressure. The processing gas in the partition member 5 flows through the respective vent holes 53 into the processing chamber 2 under a pressure corresponding to a total flow rate of the processing gas from the injector 4 and a total opening area of the vent holes 53 in the buffer plate 51.

Thus, in the first embodiment, the processing gas is injected from the injector 4 uniformly in the longitudinal direction thereof and spread horizontally in the partition member 5 to pass through the respective vent holes 53 formed in the buffer plate 51 of a large area all over the same into the interior space of the partition member 5. Thus the processing gas substantially uniformly blows out of the entire surface of the buffer plate 51 to be fed onto the surface-to-be-processed of the glass substrate G with high uniformity.

Because the processing gas is fed substantially uniformly onto the surface-to-be-processed of the glass substrate G, a thin film having an intra-surface uniform thickness can be deposited on the glass substrate G. The uniform injection of the processing gas by the injector 4 is ensured by, as described above, a shape of the injector 4 and the injection holes 42. In the present embodiment, the injection holes 42 are formed at the same pitch and in the same bore, which not only facilitates the setting and machining of the injection holes 42, but also ensures a uniform flow rate of a processing gas.

Figure 5:
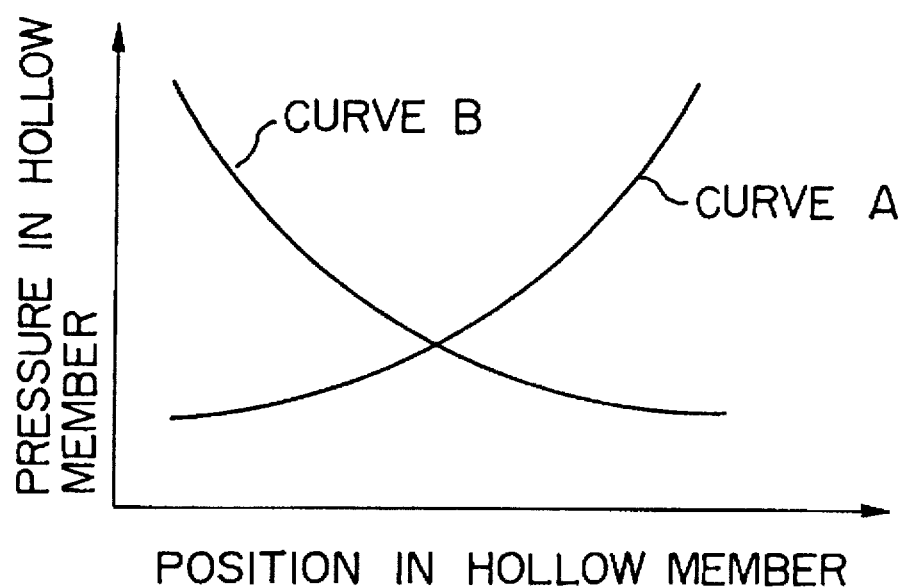
FIG. 5 is a graph of pressure distributions inside the injector.

A reason for ensuring a uniform flow rate will be explained with reference to FIG. 5 which shows pressure distributions in the hollow member. In FIG. 5, the curve A indicates a conceptional pressure distribution of flow of a gas in the longitudinal direction of the hollow member without the vent holes formed in. In this case, a pressure increases toward the forward end of the hollow member in the longitudinal direction. On the other hand, the curve processing chamber and has the other end connected to exhaust means, e.g., a vacuum pump (not shown).

Figure 4:
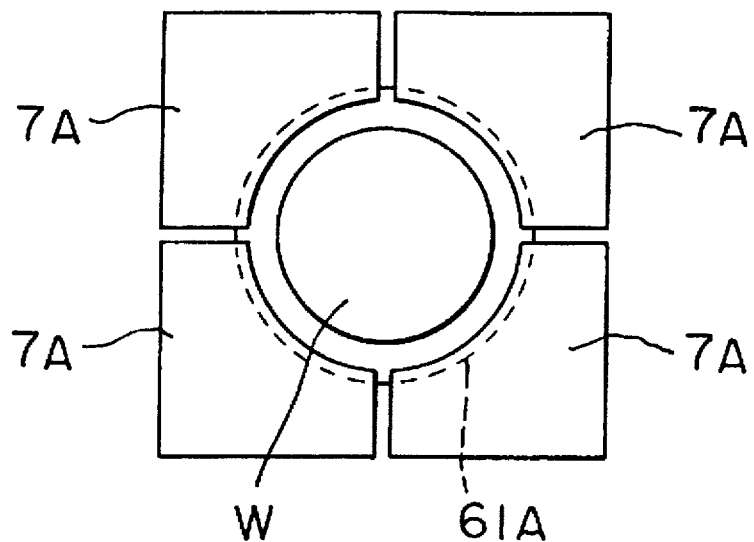
FIG. 4 is a plan view of the holding/processing unit of the processing apparatus of FIG. 1, for a substrate to be processed (semiconductor wafer).

In the present embodiment, a circular semiconductor wafer can be processed in place of the rectangular substrate to be processed (e.g., glass substrate) as an object to be processed. In this case, as shown in the plan view of FIG. 4, a semiconductor wafer W is mounted on a mount plate 61A, and a processing gas is drawn to be exhausted through exhaust pipes 7A provided on four sides.

Then, the operation of the processing apparatus according to the first embodiment of the present invention will be explained. First, as shown in FIG. 1, with one electrode 3 withdrawn upward and the gate valve 21A opened, a glass substrate G, an object to be processed, is loaded into the processing chamber 2 through the loading opening 21 by a carrying mechanism (robot) (not shown) and is placed on the mount plates 61, 62. Then, one electrode 3 is lowered to a vicinity of the glass substrate G by the lift mechanism 32. Next, a processing gas of, e.g., $SiH_4$ gas, $NH_3$ gas and $N_2$ gas, is fed at a prescribed flow rate into the processing chamber through the gas feed pipe 43 via the injector 4 and the buffer plate 51. Concurrently therewith, the interior of the processing chamber 2 is exhausted by the vacuum pump (not shown) through the exhaust pipe 7 to be maintained at a prescribed vacuum degree. A high frequency voltage is applied between the electrode 3 and the buffer plate 51 to generate plasmas, whereby an SiN film is deposited on the surface-to-be processed (the underside in FIG. 1) of the glass substrate.

At this time, because a pressure inside the injector is substantially uniform in the longitudinal direction thereof, the processing gas is injected into the space inside the partition member 5 through the respective injection holes at a flow rate which is substantially uniform in the longitudinal direction thereof. Because the partition member 5 is air-tight except the vent holes 52 in B shows a conceptional pressure distribution of flow of the gas in the hollow member having a constant cross-section area in the longitudinal direction thereof and having injection holes formed at a constant pitch and in the same bore therein. In this case, the gas flows to the forward end, being injected through the injection holes, and accordingly the interior of the hollow member has pressures which are lower toward the forward end thereof.

Accordingly, the hollow member is arranged so as to have cross-sectional areas which decrease toward the forward end thereof with the injection holes formed at a constant pitch and in the same bore, whereby a pressure gradient of the hollow member itself and a pressure gradient produced by the injection holes compensate each other, and a uniform injection pressure of the gas can be obtained in the longitudinal direction of the hollow member.

[A Second Embodiment]

Figure 6:
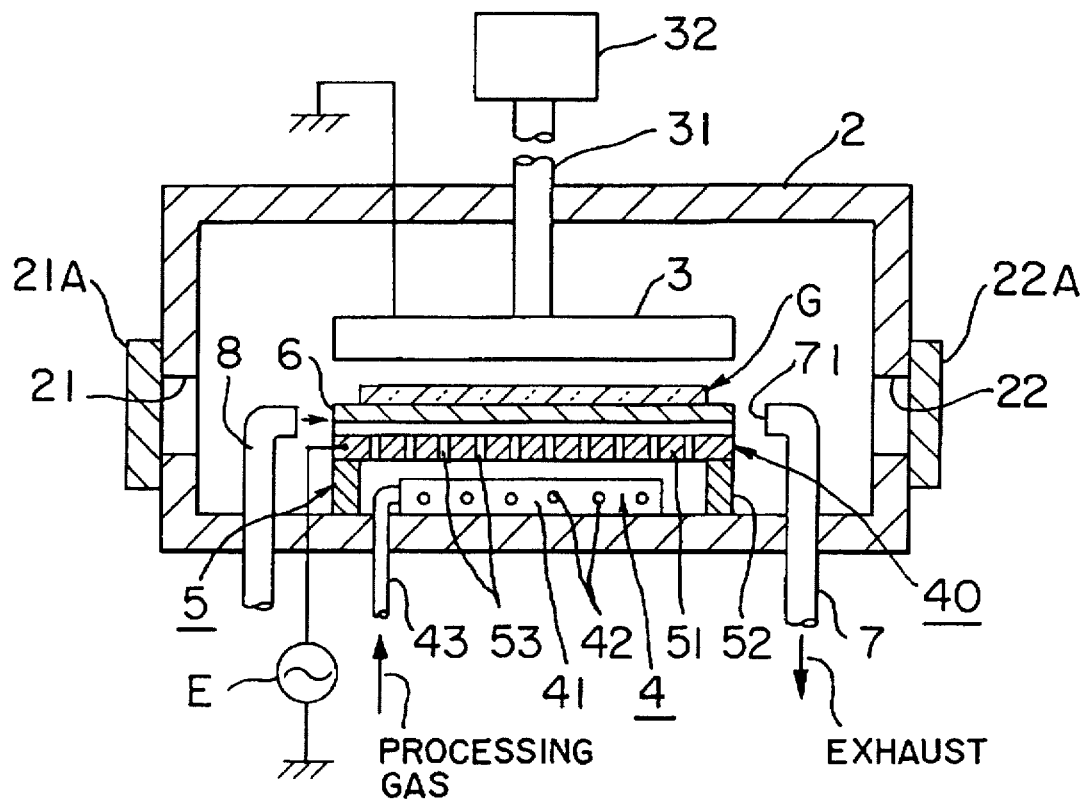
FIG. 6 is a vertical sectional view of the processing apparatus according to a second embodiment of the present invention.
Figure 7:
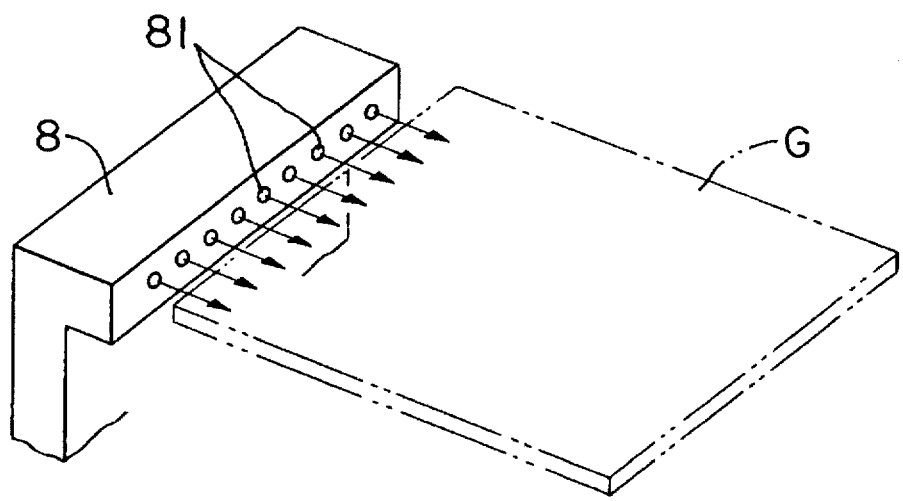
FIG. 7 is a perspective view of the gas feed means of the processing apparatus of FIG. 6.

Next, a second embodiment of the present invention will be explained. As shown in FIG. 6, the present embodiment is the plasma CVD apparatus according to the first embodiment in which a gas injection port is provided on the side of the space between a glass substrate G and the buffer plate 51, which is opposed to the exhaust port 71. The gas injection port is in the form of gas feed means 8 comprising, as exemplified in FIG. 7, an elongate rectangular parallelopiped gas feed pipe with a number of gas injection holes 81 formed therein. That is, the exhaust port 71 is disposed on one of the left and the right sides of the space between a glass substrate G and the buffer plate 51, and the gas feed means 8 is disposed on the other side opposed to said one side. In the second embodiment, the gas feed means 8 corresponds to first gas feed means, and the gas feed means including the injector 4 and the partition member 5 of the first embodiment, which is to be opposed to a glass substrate G, corresponds to second gas feed means.

Figure 8:
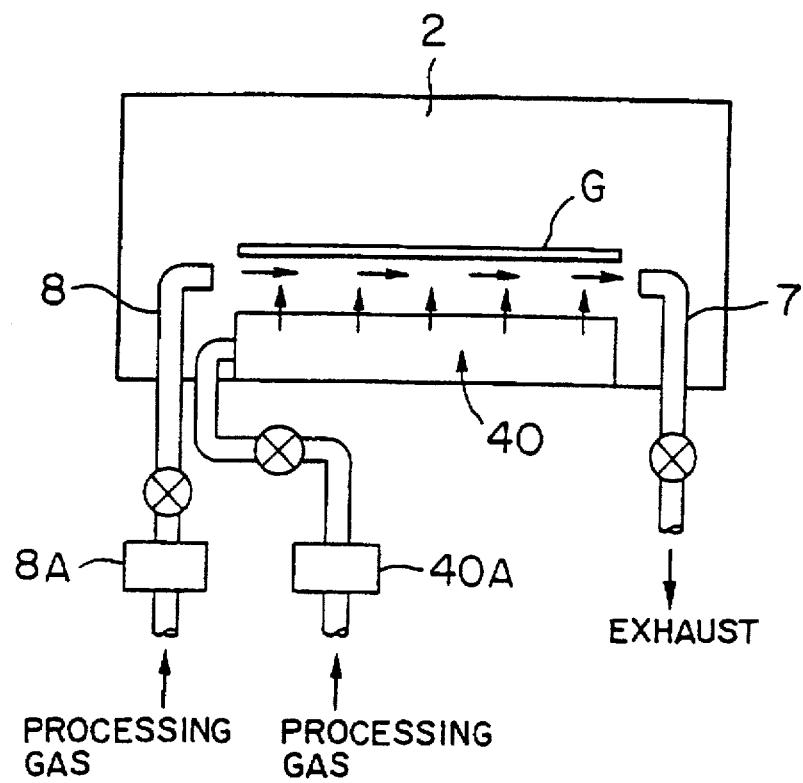
FIG. 8 is an explanatory view of the flow of a processing gas in the processing apparatus of FIG. 6.
Figure 9:
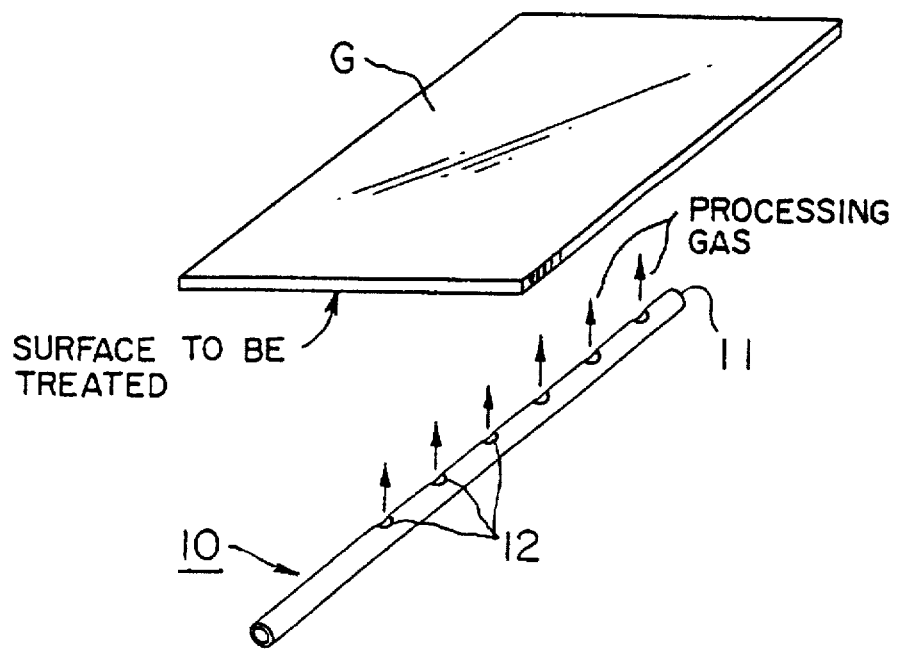
FIG. 9 is a perspective view of the gas feed unit (injector) of a conventional processing apparatus.

In the plasma CVD apparatus according to the second embodiment, in depositing a film, as shown in FIG. 8, a processing gas is fed onto a surface-to-be-processed of a glass substrate G from below by the second gas feed means 40 while the processing gas is fed by the second gas feed means 8 from, e.g., the left along the surface-to-be-processed of the glass substrate G. The thus fed processing gas is exhausted through the vent port 71 on the right side of the processing chamber 2.

By feeding a processing gas onto a glass substrate G thus in two directions, disuniform velocities of the gas flow on a surface-to-be-processed of the glass substrate G caused by feeding the processing gas in one direction from a side of the glass substrate G or below the same can be compensated. Thus the gas flow is made uniform, and gas stagnation in the processing chamber 2 can be suppressed. As a result, a thin film deposited on the glass substrate G can have improved intra-surface thickness uniformity.

In feeding a processing gas onto a glass substrate G in two directions, as shown in FIG. 8, the flow rates of the processing gas is controlled by flow rate control units 8A, 40A respectively disposed for the first and the second gas feed means 8, 40 to set various flow rate ratios. A flow rate ratio is determined based on data of the film thickness obtained by preparatory film depositions on different conditions, and based on the determined flow rate ratio, actual processing is conducted.

In the processing apparatus for a substrate to be processed according to the present invention, it is possible that the feed means may not include the partition member but include only the injector. A plurality of the injectors may be arranged. The second gas feed means of the second embodiment is not limited to that of the first embodiment. Processing to be conducted by the present invention is not limited to the film deposition but may be etching, ashing, etc. Substrates to be processed are not limited to glass substrates and semiconductor wafers.

We claim:

1. A processing apparatus comprising:
   gas feed means disposed opposed to a substrate-to-be-processed held in a processing vessel for feeding a processing gas to the substrate for processing the substrate,
   the gas feed means being disposed on a forward end of a gas feed pipe, and
   the gas feed means including a gas injection unit which includes a hollow member having cross-sectional areas which decrease toward the forward end thereof and a plurality of gas injection holes formed in the hollow member in the longitudinal direction thereof.

2. The processing apparatus according to claim 1, further comprising:
   a buffer plate having a number of vent holes formed therein, the vent holes being opposed to the gas injection unit through a space between the substrate-to-be-processed and the buffer plate; and
   a partition member enclosing the gas injection unit.

3. The processing apparatus according to claim 1, wherein a surface-to-be-processed of the substrate to be processed is faced downward.

4. The processing apparatus according to claim 1, wherein a surface-to-be-processed of the substrate to be processed is faced upward.

5. The processing apparatus according to claim 1, wherein the substrate to be processed is a glass substrate.

6. The processing apparatus according to claim 1, wherein the substrate to be processed is a semiconductor wafer.

* * * * *